United States Patent
Bhattacharjee et al.

(10) Patent No.: US 9,998,088 B2
(45) Date of Patent: Jun. 12, 2018

(54) ENHANCED MEMS VIBRATING DEVICE

(71) Applicant: RF Micro Devices, Inc., Greensboro, NC (US)

(72) Inventors: Kushal Bhattacharjee, Kernersville, NC (US); Sergei Zhgoon, Moscow (RU)

(73) Assignee: Qorvo US, Inc., Greensboro, NC (US)

( * ) Notice: Subject to any disclaimer, the term of this patent is extended or adjusted under 35 U.S.C. 154(b) by 480 days.

(21) Appl. No.: 14/703,060

(22) Filed: May 4, 2015

(65) Prior Publication Data

US 2015/0318838 A1 Nov. 5, 2015

Related U.S. Application Data

(60) Provisional application No. 61/988,116, filed on May 2, 2014.

(51) Int. Cl.
*H03H 9/25* (2006.01)
*H01L 41/09* (2006.01)
(Continued)

(52) U.S. Cl.
CPC .... *H03H 9/02228* (2013.01); *H03H 9/02338* (2013.01); *H03H 9/172* (2013.01); *H03H 2009/155* (2013.01); *H03H 2009/241* (2013.01)

(58) Field of Classification Search
CPC . H03H 9/02228; H03H 9/02338; H03H 9/172
(Continued)

(56) References Cited

U.S. PATENT DOCUMENTS 4,350,916 A * 9/1982 August .................. H03H 3/08
310/313 B
4,798,989 A 1/1989 Miyazaki et al.
(Continued)

FOREIGN PATENT DOCUMENTS

CN 105823904 A * 8/2016 ............. G01P 15/09
JP S5778206 A 5/1982
(Continued)

OTHER PUBLICATIONS

U.S. Appl. No. 12/134,483, filed Jun. 6, 2008, now U.S. Pat. No. 7,586,239.
(Continued)

*Primary Examiner* — Thomas Dougherty
(74) *Attorney, Agent, or Firm* — Withrow & Terranova, P.L.L.C.

(57) ABSTRACT

A MEMS vibrating device includes a substrate, at least one anchor on a surface of the substrate, and a vibrating body suspended over the substrate by the at least one anchor. The vibrating body includes a first piezoelectric thin-film layer, a second piezoelectric thin-film layer over the first piezoelectric thin-film layer, and an inter-digital transducer embedded between the first piezoelectric thin-film layer and the second piezoelectric thin-film layer. Embedding the inter-digital transducer between the first piezoelectric thin-film layer and the second piezoelectric thin-film layer may result in enhanced vibrational characteristics of the MEMS vibrating device, thereby increasing the performance thereof.

34 Claims, 12 Drawing Sheets

(51) Int. Cl.
*H03H 9/02* (2006.01)
*H03H 9/17* (2006.01)
*H03H 9/15* (2006.01)
*H03H 9/24* (2006.01)

(58) Field of Classification Search
USPC ..... 310/313 A, 313 B, 313 C, 313 D, 313 R, 310/348, 365; 333/193
See application file for complete search history.

(56) References Cited

U.S. PATENT DOCUMENTS

| | | | |
|---|---|---|---|
| 5,504,772 | A | 4/1996 | Deacon et al. |
| 5,565,725 | A * | 10/1996 | Nakahata ........... H03H 9/02582 |
| | | | 310/313 A |
| 5,739,624 | A | 4/1998 | Kleiman |
| 6,249,073 | B1 | 6/2001 | Nguyen et al. |
| 6,336,366 | B1 | 1/2002 | Thundat et al. |
| 6,349,454 | B1 | 2/2002 | Manfra et al. |
| 6,437,486 | B1 | 8/2002 | Burcsu et al. |
| 6,767,749 | B2 | 7/2004 | Kub et al. |
| 6,819,812 | B2 | 11/2004 | Kochergin et al. |
| 6,909,221 | B2 | 6/2005 | Ayazi et al. |
| 7,250,705 | B2 | 7/2007 | Dewa et al. |
| 7,315,107 | B2 | 1/2008 | Kando et al. |
| 7,492,241 | B2 | 2/2009 | Piazza et al. |
| 7,586,239 | B1 * | 9/2009 | Li ........................ H03H 3/0072 |
| | | | 310/323.02 |
| 7,626,846 | B2 | 12/2009 | Rao et al. |
| 7,639,105 | B2 | 12/2009 | Ayazi et al. |
| 7,750,759 | B1 | 7/2010 | Lee et al. |
| 7,791,432 | B2 | 9/2010 | Piazza et al. |
| 7,898,158 | B1 | 3/2011 | Li et al. |
| 8,035,280 | B2 | 10/2011 | Li et al. |
| 8,330,325 | B1 | 12/2012 | Burak et al. |
| 8,421,558 | B2 * | 4/2013 | Yamane ............. H03H 9/02834 |
| | | | 310/313 B |
| 8,508,108 | B2 | 8/2013 | Anand et al. |
| 9,117,593 | B2 | 8/2015 | Bhattacharjee |
| 9,369,105 | B1 | 6/2016 | Li et al. |
| 9,651,376 | B2 | 5/2017 | Zolfagharkhani et al. |
| 2003/0006676 | A1 | 1/2003 | Smith et al. |
| 2003/0119220 | A1 | 6/2003 | Mlcak et al. |
| 2004/0125472 | A1 | 7/2004 | Belt |
| 2004/0192040 | A1 | 9/2004 | Peng et al. |
| 2004/0202399 | A1 | 10/2004 | Kochergin et al. |
| 2004/0213302 | A1 | 10/2004 | Fermann et al. |
| 2005/0035687 | A1 | 2/2005 | Xu et al. |
| 2005/0184627 | A1 | 8/2005 | Sano et al. |
| 2006/0082256 | A1 | 4/2006 | Bibl et al. |
| 2006/0131997 | A1 | 6/2006 | Kim et al. |
| 2007/0200458 | A1 | 8/2007 | Yoshino et al. |
| 2007/0209176 | A1 | 9/2007 | Kawakubo et al. |
| 2007/0228887 | A1 | 10/2007 | Nishigaki et al. |
| 2007/0284971 | A1 | 12/2007 | Sano et al. |
| 2009/0200894 | A1 * | 8/2009 | Kando ..................... H03H 3/08 |
| | | | 310/313 B |
| 2010/0194499 | A1 | 8/2010 | Wang et al. |
| 2010/0237709 | A1 | 9/2010 | Hall et al. |
| 2011/0043895 | A1 | 2/2011 | Hikmet |
| 2011/0181150 | A1 | 7/2011 | Mahameed et al. |
| 2012/0200912 | A1 | 8/2012 | Hodgson et al. |
| 2012/0234093 | A1 | 9/2012 | Black et al. |
| 2013/0250383 | A1 | 9/2013 | Mater et al. |
| 2014/0125201 | A1 | 5/2014 | Bhattacharjee |
| 2014/0183669 | A1 | 7/2014 | Xu et al. |
| 2014/0210314 | A1 | 7/2014 | Bhattacharjee et al. |
| 2014/0210315 | A1 | 7/2014 | Bhattacharjee et al. |
| 2014/0292155 | A1 | 10/2014 | Ballandras et al. |
| 2016/0317228 | A1 | 11/2016 | Fermann et al. |

FOREIGN PATENT DOCUMENTS

| | | |
|---|---|---|
| JP | S5895690 A | 6/1983 |
| WO | 03042687 A1 | 5/2003 |

OTHER PUBLICATIONS

U.S. Appl. No. 12/202,624, filed Sep. 2, 2008.
U.S. Appl. No. 12/263,883, filed Nov. 3, 2008, now U.S. Pat. No. 7,898,158.
U.S. Appl. No. 13/037,584, filed Mar. 1, 2011, now U.S. Pat. No. 8,035,280.
U.S. Appl. No. 14/071,025, filed Nov. 4, 2013.
U.S. Appl. No. 14/071,173, filed Nov. 4, 2013, now U.S. Pat. No. 9,117,593.
U.S. Appl. No. 14/031,383, filed Sep. 19, 2013.
U.S. Appl. No. 14/031,454, filed Sep. 19, 2013.
U.S. Appl. No. 14/679,379, filed Apr. 6, 2015.
Aigner, R. et al., "Advancement of MEMS into RF-Filter Applications," IEDM: International Electron Devices Meeting, Dec. 8-11, 2002, pp. 897-900, San Francisco CA.
Aigner, Robert et al., "Bulk-Acoustic-Wave Filters: Performance Optimization and vol. Manufacturing," IEEE MTT-S Digest, 2003, pp. 2001-2004.
Author Unknown, "An American National Standard: IEEE Standard on Piezoelectricity," ANSI/IEEE Std 176-1987, Copyright: 1988, 74 pages, The Institute of Electrical and Electronics Engineers, Inc., New York, NY.
Author Unknown, "Soitec Innovative Process for Materials Treatments—Smart Cut(R)," Soitec, Retrieved: Apr. 20, 2010, 1 page, www.soitec.com.
Author Unknown, "Standards on Piezoelectric Crystals, 1949," Proceedings of the I.R.E., Dec. 1949, pp. 1378-1395.
Bannon, III, Frank D. et al., "High-Q HF Microelectromechanical Filters," IEEE Journal of Solid-State Circuits, vol. 35, No. 4, Apr. 2000, pp. 512-526.
Bassignot, F. et al., "A new acoustic resonator concept based on acoustic waveguides using silicon/periodically poled transducer/silicon structures for RF applications," 2011 Joint Conference of the IEEE International Frequency Control and the European Frequency and Time Forum (FCS), 6 pages.
Zhu, Yong-Yuan et al., "Ultrasonic Excitation and Propagation in an Acoustic Superlattice," Journal of Applied Physics, vol. 72, No. 3, Aug. 1, 1992, pp. 904-914.
Batchko, Robert G. et al., "Backswitch Poling in Lithium Niobate for High-Fidelity Domain Patterning and Efficient Blue Light Generation," Applied Physics Letters, vol. 75, No. 12, Sep. 20, 1999, pp. 1673-1675.
Brown, Paul T. et al., "Control of Domain Structures in Lithium Tantalate Using Interferometric Optical Patterning," Optics Communications, vol. 163, May 15, 1999, pp. 310-316.
Chandrahalim, Hengky et al., "Channel-Select Micromechanical Filters Using High-K Dielectrically Transduced MEMS Resonators," Proceedings of the 19th International IEEE Micro Electro Mechanical Systems Conference (MEMS 2006), Jan. 22-26, 2006, pp. 894-897, Istanbul, Turkey.
Chen, Yan-Feng et al., "High-Frequency Resonance in Acoustic Superlattice of Periodically Poled LiTaO3," Applied Physics Letters, vol. 70, No. 5, Feb. 3, 1997, pp. 592-594.
Courjon, E. et al., "Periodically Poled Transducers Built on Single Crystal Lithium Niobate Layers Bonded onto Silicon," IEEE Ultrasonics Symposium, 2007, pp. 268-271.
Courjon, E. et al., "Pure Longitudinal Plate Mode Excited by Poled Domains Transducers on LiNbO3," Proceedings, EFTF*IEEE-FCS'07, May 29-Jun. 1, 2007, pp. 1073-1076.
Feld, David et al., "A High Performance 3.0 mm x 3.0 mm x 1.1 mm FBAR Full Band Tx Filter for U.S. PCS Handsets," Proceedings of the 2002 IEEE Ultrasonics Symposium, pp. 913-918.
Hannon, John J. et al.., "Lithium Tantalate and Lithium Niobate Piezoelectric Resonators in the Medium Frequency Range With Low Ratios of Capacitance and Low Temperature Coefficients of Frequency," IEEE Transactions on Sonics and Ultrasonics, vol. SU-17, No. 4, Oct. 1970, pp. 239-246.
Ho, Gavin K. et al., "High-Order Composite Bulk Acoustic Resonators," Technical Digest, IEEE Int. Conf. on Micro Electro Mechanical Systems, Jan. 21-25, 2007, pp. 791-794.

(56) References Cited

OTHER PUBLICATIONS

Hsu, Wan-Thai et al., "Stiffness-Compensated Temperature-Insensitive Micromechanical Resonators," Technical Digest, IEEE International Conference on Micro Electro Mechanical Systems, 2002, pp. 731-734, Las Vegas, NV.

Iula, Antonio et al.., "A Model for the Theoretical Characterization of Thin Piezoceramic Rings," IEEE Transactions on Ultrasonics, Ferroelectrics, and Frequency Control, vol. 43, No. 3, May 1996, pp. 370-375.

Kadota, Michio et al., "High Frequency Lamb Wave Resonator using LiNbO3 Crystal Thin Plate and Application to Tunable Filter," 2010 IEEE International Ultrasonics Symposium Proceedings, 2010, pp. 962-965.

Kim, Bongsang et al., "Frequency Stability of Wafer-Scale Encapsulated MEMS Resonators," Proceedings of the 13th International Conference on Solid-State Sensors, Actuators and Microsystems, Jun. 5-9, 2005, Seoul, Korea, pp. 1965-1968.

Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, vol. 17, No. 10, Oct. 2005, pp. 2077-2079.

Kovacs, G. et al., "Improved Material Constants for LiNbO3 and LiTaO3," 1990 Ultrasonics Symposium, Copyright: 1990, pp. 435-438.

Kumar, A. K. Sarin et al., "High-Frequency Surface Acoustic Wave Device Based on Thin-Film Piezoelectric Interdigital Transducers," Applied Physics Letters, vol. 85, No. 10, Sep. 6, 2004, pp. 1757-1759.

Li, Sheng-Shian et al., "Micromechanical 'Hollow-Disk' Ring Resonators," Technical Digest, IEEE International Conference on Micro Electro Mechanical Systems, 2004, pp. 821-824, Maastricht, The Netherlands.

Li, Sheng-Shian et al., "Self-Switching Vibrating Micromechanical Filter Bank," Proceedings of the Joint IEEE Int. Frequency Control/Precision Time & Time Interval Symposium, Aug. 29-31, 2005, pp. 135-141, Vancouver, Canada.

Liu, Xiaoyan et al., "Nanoscale Chemical Etching of Near-Stoichiometric Lithium Tantalate," Journal of Applied Physics, vol. 97, 2005, pp. 064308-1 to 064308-4.

Majjad, H. et al., "Low Temperature Bonding of Interface Acoustic Waves Resonators on Silicon Wafers," Proceedings of the 2005 IEEE Ultrasonics Symposium, 2005, pp. 1307-1310.

Myers, L. E. et al., "Quasi-Phase-Matched Optical Parametric Oscillators in Bulk Periodically Poled LiNbO3," J. Opt. Soc. Am. B, vol. 12, No. 11, Nov. 1995, pp. 2102-2116.

Nakamura, Kiyoshi et al., "Local Domain Inversion in Ferroelectric Crystals and Its Application to Piezoelectric Devices," 1989 Ultrasonics Symposium, Copyright: 1989, pp. 309-318.

Onoe, Morio et al., "Zero Temperature Coefficient of Resonant Frequency in an X-Cut Lithium Tantalate at Room Temperature," Proceedings of the IEEE: Proceedings Letters, Aug. 1969, pp. 1446-1448.

Ostrovskii, I. V. et al., "Free Vibration of Periodically Poled Ferroelectric Plate," Journal of Applied Physics, vol. 99, No. 114106, 2006, pp. 114106-1 to 114106-6.

Osugi, Yukihisa et al., "Single Crystal FBAR with LiNbO3 and LiTaO3 Piezoelectric Substance Layers," Proceedings of the International Microwave Symposium Jun. 3-8, 2007, pp. 873-876, Honolulu, Hawaii.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Piazza, G. et al., "Low Motional Resistance Ring-Shaped Contour-Mode Aluminum Nitride Piezoelectric Micromechanical Resonators for UHF Applications," Proceedings of the 18th International IEEE Micro Electro Mechanical Systems Conference, Jan. 30-Feb. 3, 2005, pp. 20-23, Miami, Florida.

Ruby, R. et al., "PCS 1900 MHz Duplexer Using Thin Film Bulk Acoustic Resonators (FBARs)," Electronics Letters, vol. 35, No. 10, May 13, 1999, pp. 794-795.

Ruby, Richard C. et al., "Thin Film Bulk Wave Acoustic Resonators (FBAR) for Wireless Applications," 2001 IEEE Ultrasonics Symposium, 2001, pp. 813-821.

Ruby, Richard et al., "Ultra-Miniature High-Q Filters and Duplexers Using FBAR Technology," 2001 IEEE International Solid-State Circuits Conference, Feb. 6, 2001, 3 pages.

Sliker, T. R. et al., "Frequency-Temperature Behavior of X-Cut Lithium Tantalate Resonators," Proceedings of the IEEE, Aug. 1968, p. 1402.

Smith, R. T. et al., "Temperature Dependence of the Elastic, Piezoelectric, and Dielectric Constants of Lithium Tantalate and Lithium Niobate," Journal of Applied Physics, vol. 42, No. 6, May 1971, pp. 2219-2230.

Stephanou, P. J. et al., "GHz Contour Extensional Mode Aluminum Nitride MEMS Resonators," Proceedings, IEEE Ultrasonics Symposium, Oct. 3-6, 2006, pp. 2401-2404.

Stephanou, P.J. et al., "GHz Higher Order Contour Mode ALN Annular Resonators," IEEE 20th International Conference on Micro Electro Mechanical Systems, Jan. 21-25, 2007, Kobe, Japan, pp. 787-790.

Wang, Jing et al., "1.14-GHz Self-Aligned Vibrating Micromechanical Disk Resonator," Technical Digest of the 2003 Radio Frequency Integrated Circuits Symposium, Jun. 8-10, 2003, pp. 335-338, Philadelphia, Pennsylvania.

Wang, Jing et al., "1.156-GHz Self-Aligned Vibrating Micromechanical Disk Resonator," IEEE Transactions on Ultrasonics, Ferroelectrics, and Frequency Control, vol. 51, No. 12, Dec. 2004, pp. 1607-1628.

Warner, A. W. et al., "Low Temperature Coefficient of Frequency in a Lithium Tantalate Resonator," Proceedings of the IEEE, Mar. 1967, p. 450.

Weisstein, Eric W., "Euler Angles," MathWorld—A Wolfram Web Resource, Retrieved: Apr. 29, 2009, http://mathworld.wolfram.com/EulerAngles.html, 4 pages.

Wong, Ark-Chew et al., "Micromechanical Mixer-Filters ('Mixlers')," Journal of Microelectromechanical Systems, vol. 13, No. 1, Feb. 2004, pp. 100-112.

Yamada, M. et al., "First-Order Quasi-Phase Matched LiNbO3 Waveguide Periodically Poled by Applying an External Field for Efficient Blue Second-Harmonic Generation," Applied Physics Letters, vol. 62, No. 5 Feb. 1, 1993, pp. 435-436.

Zhu, Yong-Yuan et al., "Crossed Field Excitation of an Acoustic Superlattice," Journal of Physics D: Applied Physics, vol. 29, 1996, pp. 185-187.

Quayle Action for U.S. Appl. No. 14/071,025, dated Mar. 8, 2016, 6 pages.

Notice of Allowance for U.S. Appl. No. 14/031,383, dated Mar. 14, 2016, 8 pages.

Notice of Allowance for U.S. Appl. No. 14/031,454, dated Mar. 4, 2016, 8 pages.

Notice of Allowance for U.S. Appl. No. 12/134,483, dated Mar. 24, 2009, 6 pages.

Notice of Allowance for U.S. Appl. No. 12/263,883, dated Oct. 28, 2010, 6 pages.

Notice of Allowance for U.S. Appl. No. 13/037,584, dated Jun. 9, 2011, 7 pages.

Notice of Allowance for U.S. Appl. No. 14/071,173, dated Apr. 21, 2015, 8 pages.

Non-Final Office Action for U.S. Appl. No. 12/202,624, dated May 18, 2012, 8 pages.

Final Office Action for U.S. Appl. No. 12/202,624, dated Jul. 27, 2012, 8 pages.

Advisory Action for U.S. Appl. No. 12/202,624, dated Sep. 7, 2012, 3 pages.

Non-Final Office Action for U.S. Appl. No. 12/202,624, dated Mar. 5, 2014, 8 pages.

Non-Final Office Action for U.S. Appl. No. 12/202,624, dated Apr. 9, 2015, 7 pages.

(56) References Cited

OTHER PUBLICATIONS

Non-Final Office Action for U.S. Appl. No. 14/679,379, dated Oct. 6, 2017, 6 pages.

* cited by examiner

ENHANCED MEMS VIBRATING DEVICE

RELATED APPLICATIONS

This application claims the benefit of U.S. provisional patent application Ser. No. 61/988,116, filed May 2, 2014, the disclosure of which is incorporated herein by reference in its entirety.

FIELD OF THE DISCLOSURE

The present disclosure relates to micro-electrical-mechanical systems (MEMS) devices, and specifically to MEMS vibrating devices such as resonators and filters.

BACKGROUND

Micro-electrical-mechanical systems (MEMS) devices come in a variety of different types and are utilized across a broad range of applications. One type of MEMS device that may be used in applications such as radio frequency (RF) circuitry is a MEMS vibrating device. A MEMS vibrating device generally includes a vibrating body supported by at least one anchor and including a piezoelectric thin-film layer in contact with one or more conductive layers, which are often referred to as electrodes. As an electrical signal is presented to one or more of the electrodes, the piezoelectric properties of the thin-film layer cause the layer to mechanically deform. The mechanical deformation of the thin-film layer in turn causes changes in the electrical characteristics of the thin-film layer, which may be utilized by circuitry connected to the device to perform one or more functions.

Many different configurations for the piezoelectric thin-film layer and the electrodes have been explored, and often result in variations in the vibrating characteristics of MEMS devices. For example, the piezoelectric thin-film layer of a MEMS vibrating device may be periodically poled in order to enhance one or more vibrational modes of the device, as discussed in U.S. Pat. No. 8,035,280 issued to RF Micro Devices of Greensboro, N.C., the contents of which are hereby incorporated by reference in their entirety. Further, the electrodes of a MEMS vibrating device may be provided in the form of an inter-digital transducer on a surface of the piezoelectric thin-film layer in order to enhance one or more vibrational modes of the device, as discussed in U.S. application Ser. No. 14/031,383, now U.S. Pat. No. 9,391,588, assigned to RF Micro Devices of Greensboro, N.C., the contents of which are hereby incorporated by reference in their entirety. While conventional solutions have resulted in improvements to MEMS devices, there is a persistent need for improved MEMS vibrating devices having high-Q, stability, repeatability, and accuracy while maintaining low loss, motional impedance, and a low temperature coefficient of frequency.

SUMMARY

The present disclosure relates to micro-electrical-mechanical systems (MEMS) devices, and specifically to MEMS vibrating devices such as resonators and filters. In one embodiment, a MEMS device includes a substrate, at least one anchor on a surface of the substrate, and a vibrating body suspended over the substrate by the at least one anchor. The vibrating body includes a first piezoelectric thin-film layer, a second piezoelectric thin-film layer over the first piezoelectric thin-film layer, and an inter-digital transducer embedded between the first piezoelectric thin-film layer and the second piezoelectric thin-film layer. Embedding the inter-digital transducer between the first piezoelectric thin-film layer and the second piezoelectric thin-film layer may result in enhanced vibrational characteristics of the MEMS device, thereby increasing the performance thereof.

In one embodiment, a polarization of the first piezoelectric thin-film layer is parallel to a polarization of the second piezoelectric thin-film layer. In such an embodiment, the polarization of the first piezoelectric thin-film layer and the polarization of the second piezoelectric thin-film layer may be parallel to the surface of the substrate, perpendicular to the surface of the substrate, or oblique to the surface of the substrate.

In one embodiment, the polarization of the first piezoelectric thin-film layer is opposite the polarization of the second piezoelectric thin-film layer. In such an embodiment, the polarization of the first piezoelectric thin-film layer and the polarization of the second piezoelectric thin-film layer may be parallel to the surface of the substrate, perpendicular to the surface of the substrate, or oblique to the surface of the substrate.

In one embodiment, the MEMS device further includes a functional layer over a surface of the first piezoelectric thin-film layer facing the substrate. The MEMS device may further or separately include an additional functional layer over a surface of the second piezoelectric thin-film layer opposite the first piezoelectric thin-film layer.

In one embodiment, the MEMS device further includes a first conductive layer over the surface of the first piezoelectric thin-film layer facing the substrate. The MEMS device may further or separately include a second conductive layer over a surface of the second piezoelectric thin-film layer opposite the first piezoelectric thin-film layer.

In one embodiment, a MEMS device includes a substrate, at least one anchor on a surface of the substrate, and a vibrating body suspended over the substrate by the anchor. The vibrating body includes a first piezoelectric thin-film layer, a second piezoelectric thin-film layer over the first piezoelectric thin-film layer, an interposer layer between the first piezoelectric thin-film layer and the second piezoelectric thin-film layer, and an inter-digital transducer embedded in the interposer layer. Embedding the inter-digital transducer between the first piezoelectric thin-film layer and the second piezoelectric thin-film layer in the interposer layer may result in enhanced vibrational characteristics of the MEMS device, thereby increasing the performance thereof.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
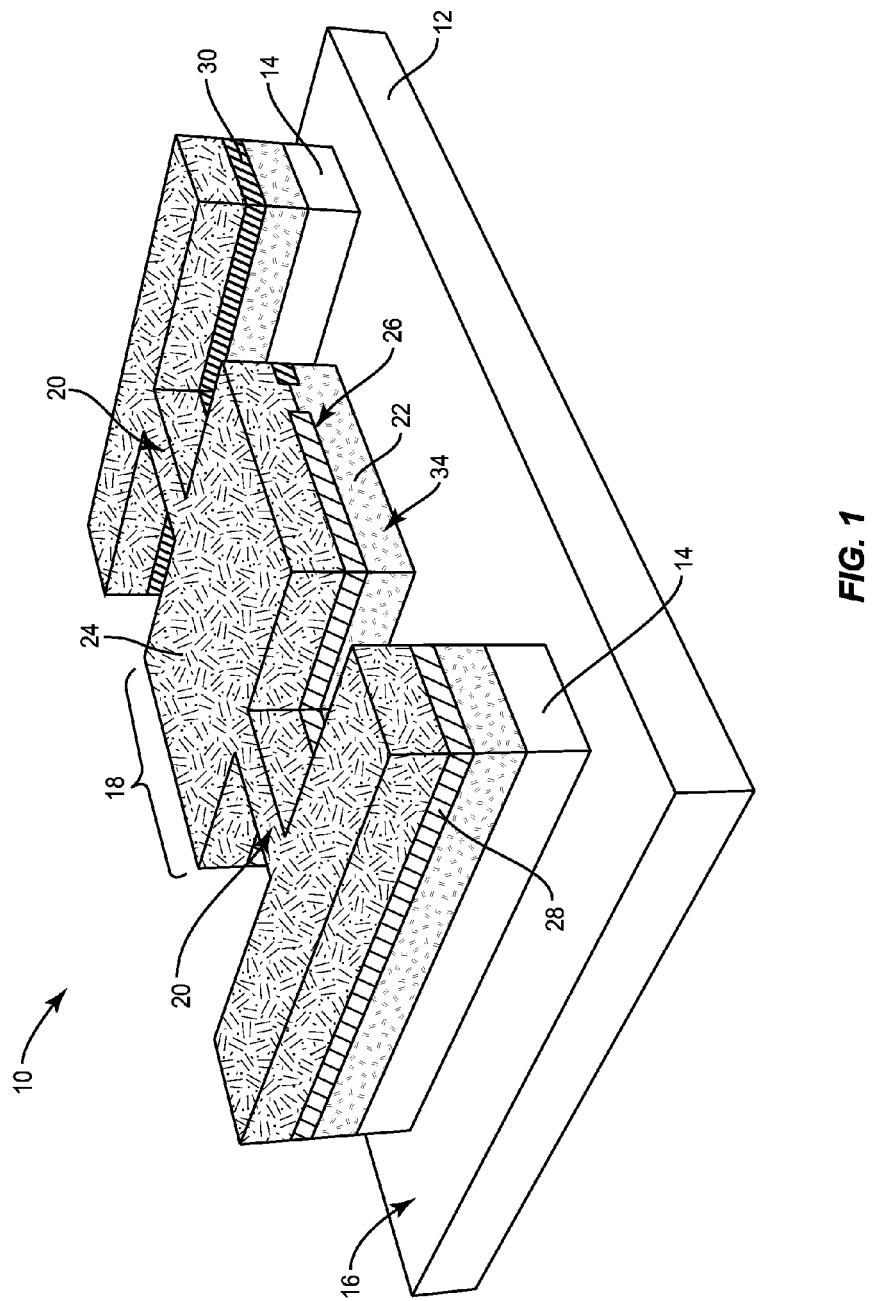
FIG. 1 is a three-dimensional representation of a micro-electrical-mechanical systems (MEMS) device according to one embodiment of the present disclosure.
Figure 2:
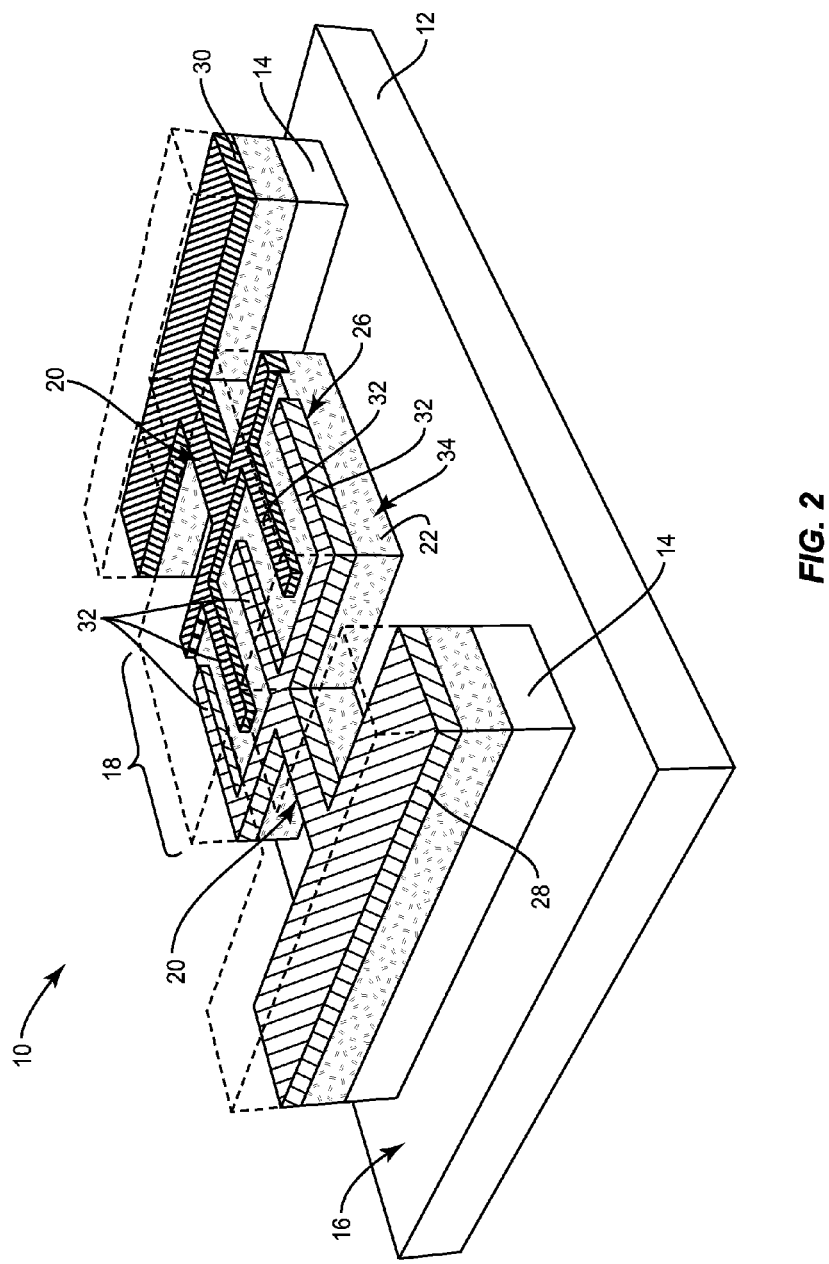
FIG. 2 is a three-dimensional representation of the MEMS device of FIG. 1 showing further details thereof according to one embodiment of the present disclosure.

FIGS. 1 and 2 show three-dimensional representations of a MEMS vibrating device 10 according to one embodiment of the present disclosure. The MEMS vibrating device 10 includes a substrate 12, a number of anchors 14 formed on a top surface 16 of the substrate 12, and a vibrating body 18 suspended over the substrate 12 by one or more mechanical support members 20 attached to the number of anchors 14. The vibrating body 18 includes a first piezoelectric thin-film layer 22, a second piezoelectric thin-film layer 24 over the first piezoelectric thin-film layer 22 such that the second piezoelectric thin-film layer 24 is on a surface of the first piezoelectric thin-film layer 22 opposite the substrate 12, and an inter-digital transducer 26 embedded between the first piezoelectric thin-film layer 22 and the second piezoelectric thin-film layer 24. The inter-digital transducer 26 includes a first electrode 28 and a second electrode 30. The first electrode 28 and the second electrode 30 each include a number of interlocking conductive sections 32. While a certain number of interlocking conductive sections 32 are shown for purposes of illustration in the first electrode 28 and the second electrode 30, the first electrode 28 and the second electrode 30 may include any number of interlocking conductive sections 32 without departing from the principles of the present disclosure. A portion of the first piezoelectric thin-film layer 22, the second piezoelectric thin-film layer 24, the first electrode 28, and the second electrode 30 may each form part of the one or more mechanical support members 20 and extend over the number of anchors 14 to provide support for the vibrating body 18.

As will be appreciated by those of ordinary skill in the art, piezoelectric materials such as the first piezoelectric thin-film layer 22 and the second piezoelectric thin-film layer 24 include one or more ferroelectric domains, which are areas in the piezoelectric material in which dipoles are uniformly oriented. The orientation of the ferroelectric domains in the first piezoelectric thin-film layer 22 and the second piezoelectric thin-film layer 24 may be established via a poling process in which an electric field with particular poling orientation is provided to the first piezoelectric material 22 and the second piezoelectric material 24 in order to align the dipoles therein to a desired orientation. The orientation of dipoles (referred to herein as a polarization) of the first piezoelectric thin-film layer 22 and the second piezoelectric thin-film layer 24, both independently and with respect to one another, may control one or more operating characteristics of the MEMS vibrating device 10, for example, by enhancing certain vibrating modes thereof.

In one embodiment, a polarization of the first piezoelectric thin-film layer 22 is parallel to a polarization of the second piezoelectric thin-film layer, such that the dipoles in the first piezoelectric thin-film layer 22 are oriented in substantially the same direction as the dipoles in the second piezoelectric thin-film layer 24. In such an embodiment, the polarization of the first piezoelectric thin-film layer 22 and the second piezoelectric thin-film layer 24 may be perpendicular with respect to the top surface 16 of the substrate 12 such that the dipoles in the first piezoelectric thin-film layer 22 and the second piezoelectric thin-film layer 24 are oriented at a 90° angle or a 270° angle with respect to the top surface 16 of the substrate 12. Further, the polarization of the first piezoelectric thin-film layer 22 and the second piezoelectric thin-film layer 24 may be parallel to the top surface 16 of the substrate 12 such that the dipoles in the first piezoelectric thin-film layer 22 and the second piezoelectric thin-film layer 24 are oriented at a 0° angle or a 180° angle with respect to the top surface 16 of the substrate 12. Finally, the polarization of the first piezoelectric thin-film layer 22 and the second piezoelectric thin-film layer 24 may be oblique with respect to the top surface 16 of the substrate 12 such that the dipoles in the first piezoelectric thin-film layer 22 and the second piezoelectric thin-film layer 24 are oriented at any of a 1°-89° angle, a 91°-179° angle, a 181°-269° angle, and a 271°-359° angle with respect to the top surface 16 of the substrate 12.

In various embodiments, the first piezoelectric thin-film layer 22 and the second piezoelectric thin-film layer 24 comprise one or more of lithium niobate, lithium tantalate, or the like. In general, the first piezoelectric thin-film layer 22 and the second piezoelectric thin-film layer 24 may comprise any suitable piezoelectric materials without departing from the principles of the present disclosure. The inter-digital transducer 18 may comprise any suitable conducting material such as copper, tin, or the like.

In operation, a first AC signal is applied to the first electrode 28, while a second AC signal that is 180° out of phase with the first AC signal is applied to the second electrode 30. Because the first AC signal is 180° out of phase with the second AC signal, the area of the first piezoelectric thin-film layer 22 and the second piezoelectric thin-film layer 24 surrounding the first electrode 28 will mechanically deform in a first manner, while the area of the first piezoelectric thin-film layer 22 and the second piezoelectric thin-film layer 24 surrounding the second electrode 30 will mechanically deform in a second and opposite manner. For example, if the area of the first piezoelectric thin-film layer 22 and the second piezoelectric thin-film layer 24 surrounding the first electrode 28 expands, the area of the first piezoelectric thin-film layer 22 and the second piezoelectric thin-film layer 24 surrounding the second electrode 30 will contract, and vice-versa. Those of ordinary skill in the art will readily appreciate that the particular mechanical deformation experienced by the first piezoelectric thin-film layer 22 and the second piezoelectric thin-film layer 24 will vary based on the particular signals applied to the inter-digital transducer 18, the material of the first piezoelectric thin-film layer 22 and the second piezoelectric thin-film layer 24, and the polarization of the first piezoelectric thin-film layer 22 and the second piezoelectric thin-film layer 24.

Embedding the first electrode 28 and the second electrode 30 between the first piezoelectric thin-film layer 22 and the second piezoelectric thin-film layer 24 may result in the ability to excite vibrational modes with enhanced performance characteristics. For example, embedding the first electrode 28 and the second electrode 30 between the first piezoelectric thin-film layer 22 and the second piezoelectric thin-film layer 24 may allow the MEMS vibrating device 10 to operate in S0 and SH0 vibrational modes with improved performance. Further, embedding the first electrode 28 and the second electrode 30 between the first piezoelectric thin-film layer 22 and the second piezoelectric thin-film layer 24 may result in enhanced coupling and relative independence of the frequency response of the MEMS vibrating device 10 from thickness variation in the vibrating body 18, which may be difficult to manufacture to tight tolerances.

Figure 3:
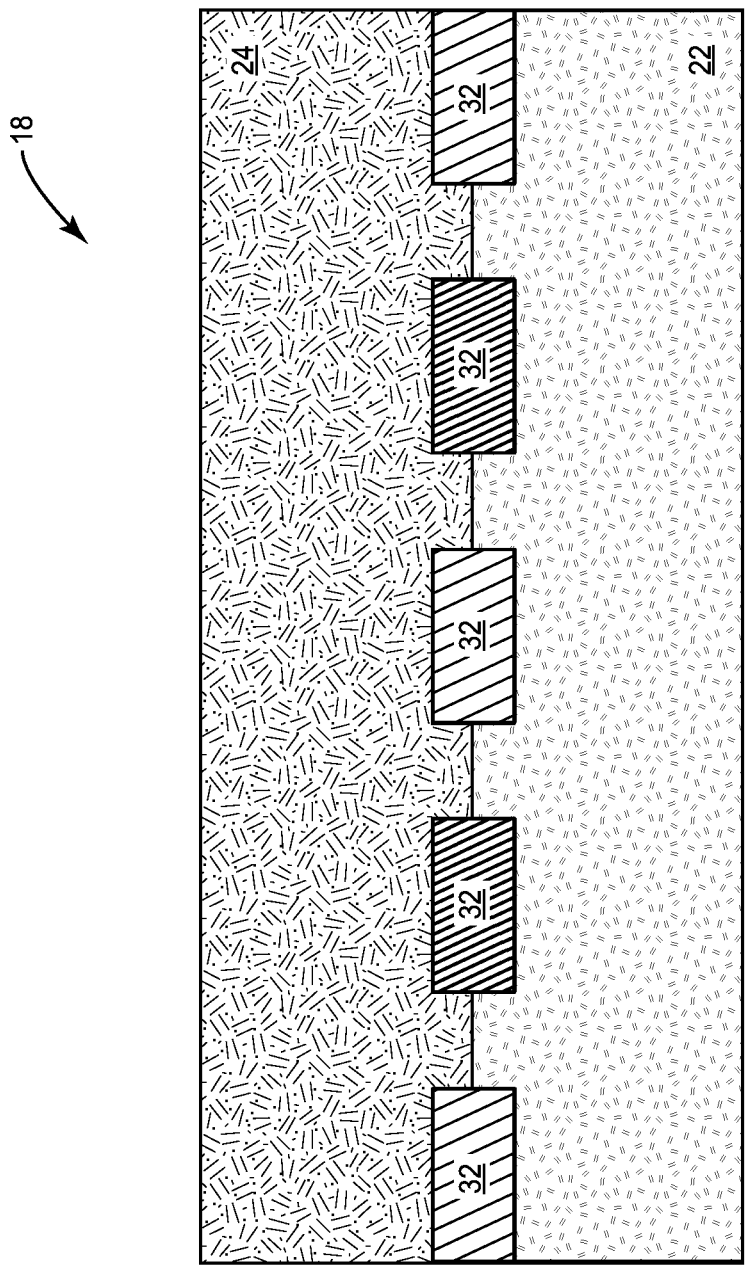
FIG. 3 is a cross-sectional view of a vibrating body in the MEMS device shown in FIGS. 1 and 2 according to one embodiment of the present disclosure.

FIG. 3 shows a cross-sectional view of the vibrating body 18 according to one embodiment of the present disclosure. Specifically, FIG. 3 shows a cross-section taken perpendicular to a front surface 34 (not shown) of the vibrating body 18 as shown in FIGS. 1 and 2. The vibrating body 18 includes the first piezoelectric thin-film layer 22, the second piezoelectric thin-film layer 24, and the inter-digital transducer 26. Specifically, the first electrode 28 and the second electrode 30 of the inter-digital transducer 26 are embedded between the first piezoelectric thin-film layer 22 and the second piezoelectric thin-film layer 24 such that a thickness $T_{CS}$ of the interlocking conductive sections 32 of each one of the first electrode 28 and the second electrode 30 is equally distributed between the first piezoelectric thin-film layer 22 and the second piezoelectric thin-film layer 24. In various embodiments, the thickness $T_{CS}$ of the interlocking conductive sections 32 in the first electrode 28 is equal to the thickness $T_{CS}$ of the interlocking conductive sections 32 in the second electrode 30. However, the thickness $T_{CS}$ of the interlocking conductive sections 32 in the first electrode 28 may differ from the thickness $T_{CS}$ of the interlocking conductive sections 32 in the second electrode 30 without departing from the principles of the present disclosure. In one embodiment, the thickness $T_{CS}$ of the interlocking conductive sections 32 in both the first electrode 28 and the second electrode 30 is between about 0.001 and 0.5 wavelengths. The various measurements discussed herein with respect to the MEMS vibrating device 10 are presented in wavelengths. As will be understood by those of ordinary skill in the art, a wavelength is measured as the center-to-center distance between two adjacent interlocking conductive sections 32 having the same polarity (i.e., both of the interlocking conductive sections 32 are in either the first electrode 28 or the second electrode 30) in the inter-digital transducer 26, or alternatively as the center-to-center distance between two adjacent interlocking conductive sections 32 of opposite polarities (i.e., one of the interlocking conducting sections 32 is in the first electrode 28 while the other interlocking conductive section 32 is in the second electrode 30) in the inter-digital transducer 26 multiplied by two.

Each one of the interlocking conductive sections 32 of the first electrode 28 may be associated with a width $W_{CS}$. In some embodiments, the width $W_{CS}$ of the interlocking conductive sections 32 in the first electrode 28 is equal to the width $W_{CS}$ of the interlocking conductive sections 32 in the second electrode 30. However, the width $W_{CS}$ of the interlocking conductive sections 32 in the first electrode 28 may differ from the width $W_{CS}$ of the interlocking conductive sections 32 in the second electrode 30 without departing from the principles of the present disclosure. In one embodiment, the width $W_{CS}$ of the interlocking conductive sections 32 in both the first electrode 28 and the second electrode 30 is between about 0.001 and 0.5 wavelengths.

The first piezoelectric thin-film layer 22 may be associated with a thickness TFP and a width WFP. In one embodiment, the thickness TFP of the first piezoelectric thin-film layer 22 is between about 0.01 and 10 wavelengths, and the width WFP of the first piezoelectric thin-film layer 22 is between about 0.1 and 10000 wavelengths. The second piezoelectric thin-film layer 22 may be associated with a thickness TSP and a width WSP. In one embodiment, the thickness TSP of the second piezoelectric thin-film layer 24 is between about 0.01 and 10 wavelengths, and a width WSP of the second piezoelectric thin-film layer 24 is between about 0.1 and 10000 wavelengths. The thickness TFP of the first piezoelectric layer 22 and the thickness TSP of the second piezoelectric thin-film layer 24 are equal; however, the thickness TFP of the first piezoelectric thin-film layer 22 may differ from the thickness TSC of the second piezoelectric thin-film layer 24 without departing from the principles of the present disclosure. While the vibrating body 18 is shown as a square shape, any shape may be used for the vibrating body without departing from the principles of the present disclosure. Various shapes of the vibrating body 18 are discussed in U.S. patent application Ser. No. 14/031,383, now U.S. Pat. No. 9,391,588, assigned to RF Micro Devices of Greensboro, N.C., the contents of which are herein incorporated by reference in their entirety.

Figure 4:
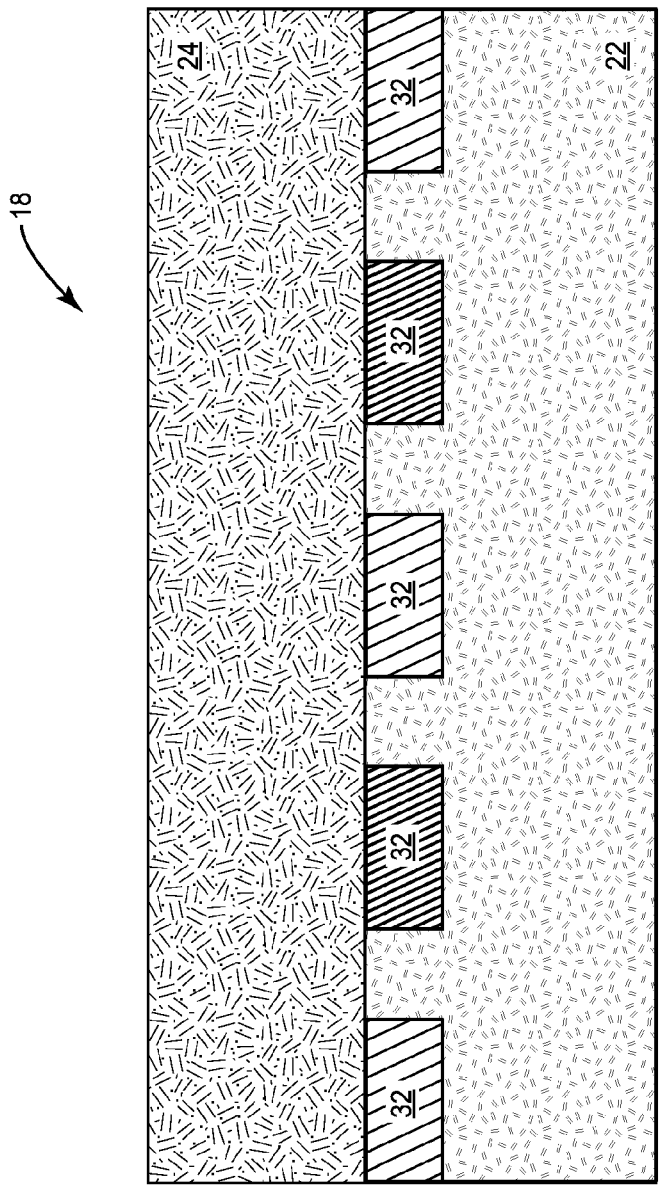
FIG. 4 is a cross-sectional view of a vibrating body in the MEMS device shown in FIGS. 1 and 2 according to one embodiment of the present disclosure.

FIG. 4 shows a cross-sectional view of the vibrating body 18 according to an additional embodiment of the present disclosure. Similar to FIG. 3 described above, FIG. 4 shows a cross-section of the vibrating body 18 taken perpendicular to the front surface 34 of the vibrating body 18. The vibrating body 18 shown in FIG. 4 is substantially similar to that shown in FIG. 3 except that the inter-digital transducer 18 is embedded completely in the first piezoelectric thin-film layer 22. In other words, the entire thickness $T_{CS}$ of the interlocking conductive sections 32 in the first electrode 28 and the second electrode 30 is located completely within the first piezoelectric thin-film layer 22.

Figure 5:
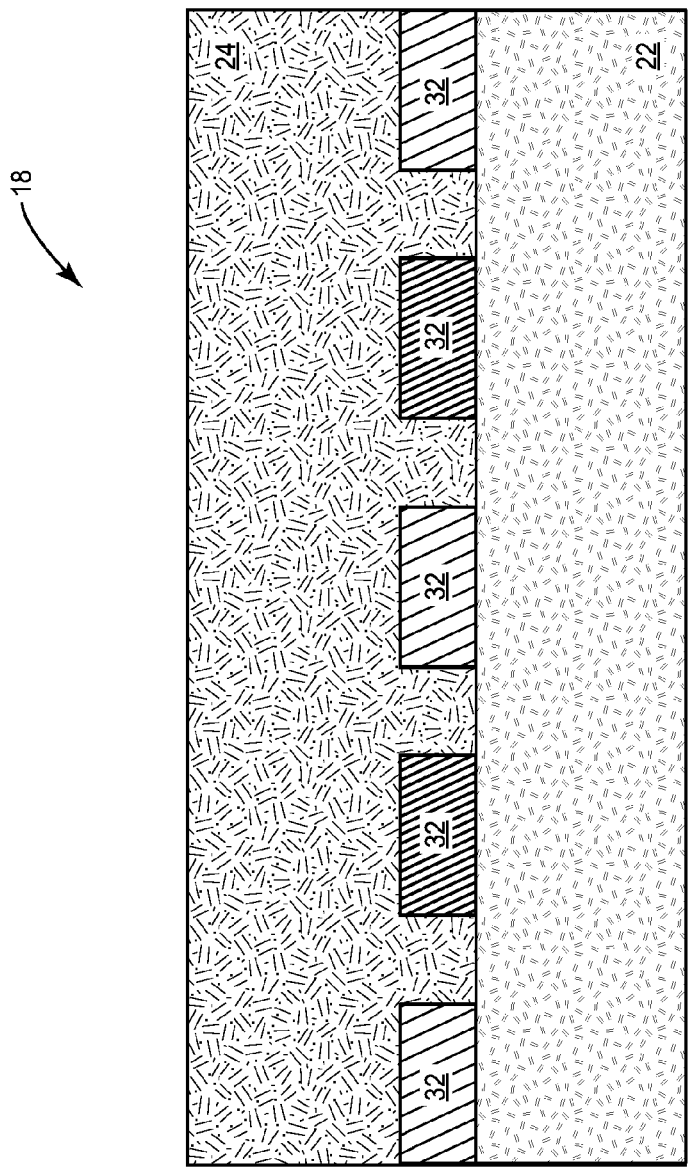
FIG. 5 is a cross-sectional view of a vibrating body in the MEMS device shown in FIGS. 1 and 2 according to one embodiment of the present disclosure.

FIG. 5 shows a cross-sectional view of the vibrating body 18 according to an additional embodiment of the present disclosure. Similar to FIGS. 3 and 4 described above, FIG. 5 shows a cross-section of the vibrating body 18 taken perpendicular to the front surface 34 of the vibrating body 18. The vibrating body 18 shown in FIG. 5 is substantially similar to that discussed above except that the inter-digital transducer 18 is embedded completely in the second piezoelectric thin-film layer 24. In other words, the entire thickness $T_{CS}$ of the interlocking conductive sections 32 of the first electrode 28 and the second electrode 30 is located completely within the second piezoelectric thin-film layer 22.

Figure 6:
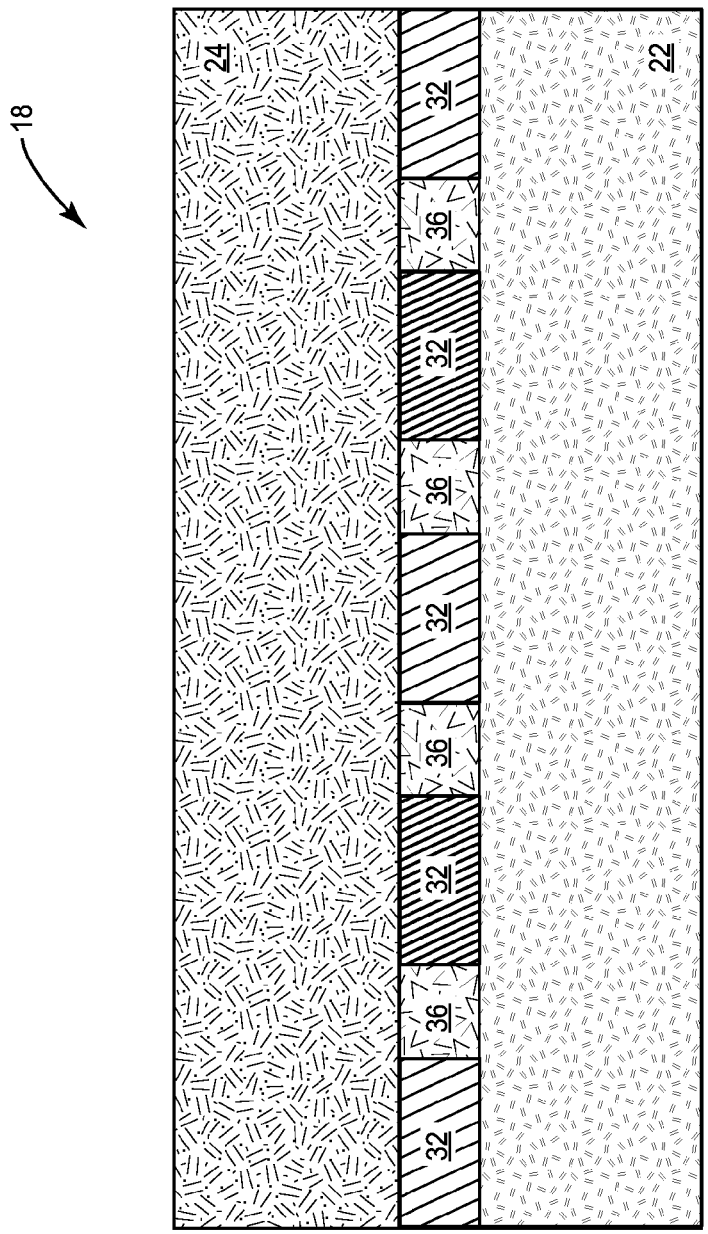
FIG. 6 is a cross-sectional view of a vibrating body in the MEMS device shown in FIGS. 1 and 2 according to one embodiment of the present disclosure.

FIG. 6 shows a cross-sectional view of the vibrating body 18 according to an additional embodiment of the present disclosure. Similar to FIGS. 3, 4, and 5 discussed above, FIG. 6 shows a cross-section of the vibrating body 18 taken perpendicular to the front surface 34 of the vibrating body 18. The vibrating body 18 shown in FIG. 6 is substantially similar to that discussed above except that the vibrating body 18 further includes an interposer layer 36 in which the inter-digital transducer 18 is embedded. That is, the entire thickness $T_{CS}$ of the interlocking conductive sections 32 in the first electrode 28 and the second electrode 30 is located within the interposer layer 36. In addition to supporting the inter-digital transducer 18, the interposer layer 36 may serve one or more functions within the MEMS vibrating device 10. For example, the interposer layer 36 may be a thermally conductive layer configured to increase heat dissipation within the MEMS vibrating device 10. In general, the interposer layer 36 may comprise any suitable material, and may be specifically chosen to enhance one or more operating characteristics of the MEMS device 10. In various embodiments, the interposer layer 36 may comprise silicon dioxide, silicon nitride, aluminum oxide, or any other suitable material. Further, the interposer layer 36 may be associated with a thickness $T_{IL}$, which may be the same or different from the thickness $T_{CS}$ of the conductive sections 32. In one embodiment, the thickness $T_{IL}$ of the interposer layer 36 is between about 0.001 and 0.5 wavelengths.

Figure 7:
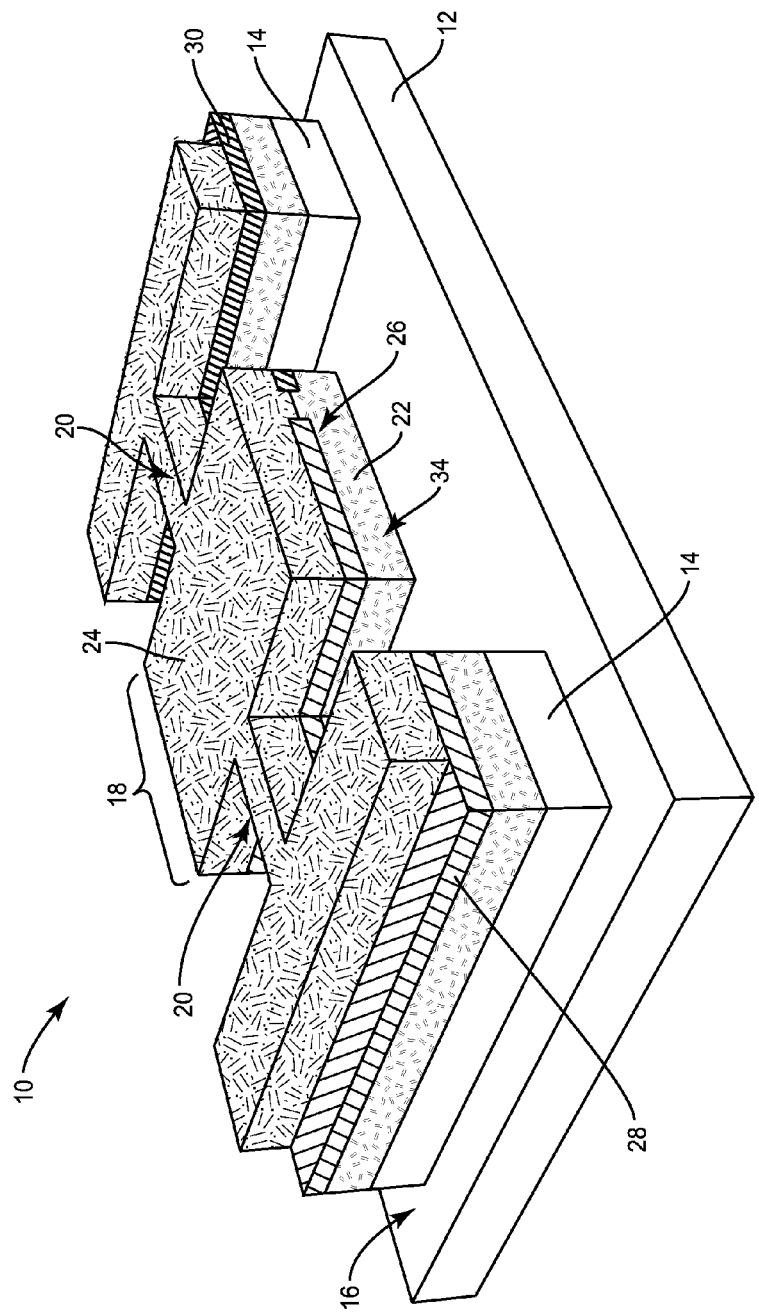
FIG. 7 is a three-dimensional representation of a MEMS device according to one embodiment of the present disclosure.

FIG. 7 shows the MEMS vibrating device 10 according to an additional embodiment of the present disclosure. The MEMS vibrating device 10 shown in FIG. 7 is substantially similar to that described above with respect to FIGS. 1 and 2, except that the MEMS vibrating device 10 includes a portion of the second piezoelectric thin-film layer 24 that has been etched away to expose a portion of the first electrode 28 and the second electrode 30 on a surface of each one of the anchors 14. The exposed portions of the first electrode 28 and the second electrode 30 may make it easier to electrically connect to the first electrode 28 and the second electrode 30.

Figure 8:
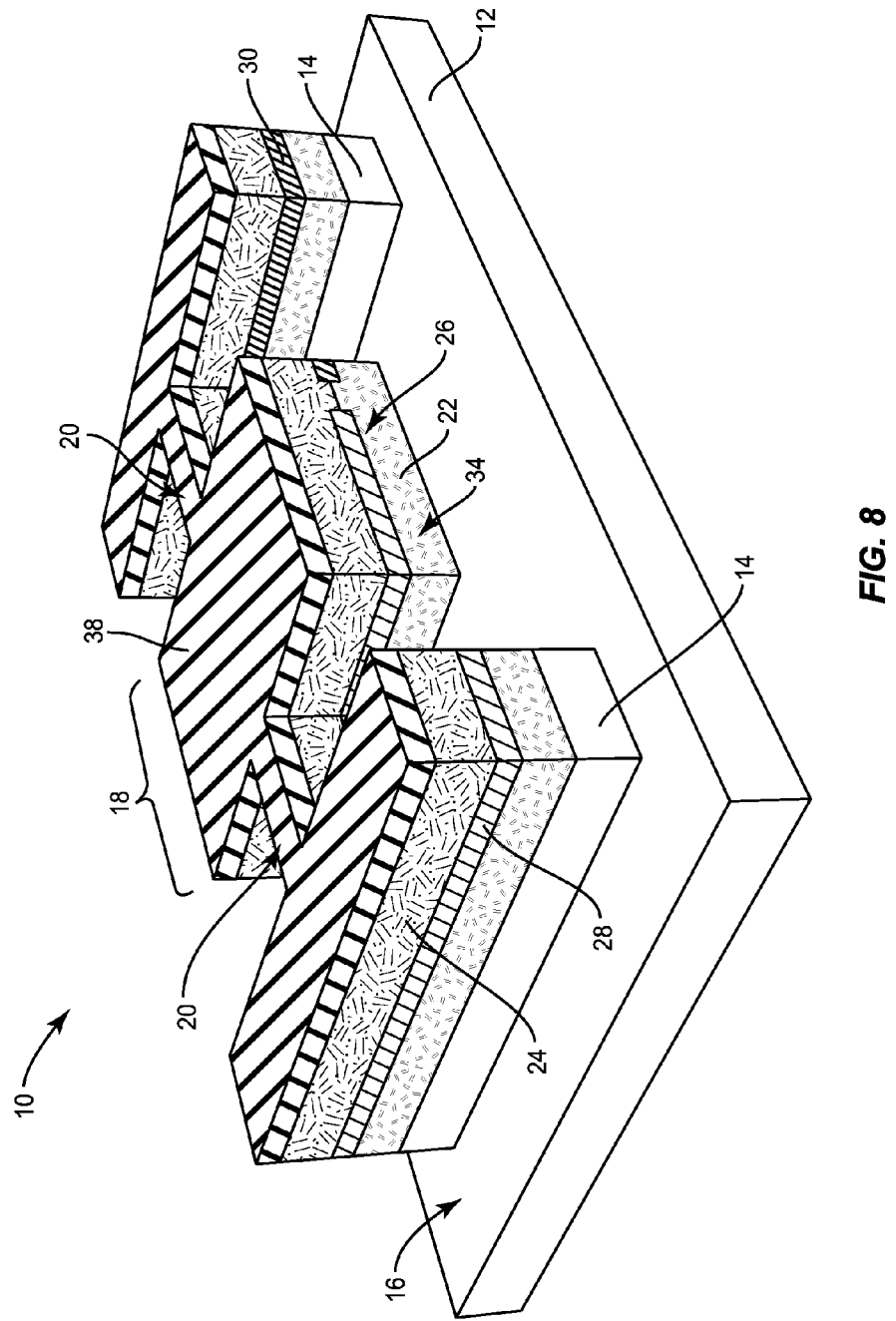
FIG. 8 is a three-dimensional representation of a MEMS device according to one embodiment of the present disclosure.

FIG. 8 shows the MEMS vibrating device 10 according to an additional embodiment of the present disclosure. The MEMS vibrating device 10 shown in FIG. 8 is substantially similar to that discussed above with respect to FIGS. 1 and 2, but further includes a third electrode 38 over a surface of the second piezoelectric thin-film layer 24 opposite the first piezoelectric thin-film layer 22. The third electrode 38 may be a solid electrode, and may extend over the one or more mechanical support members 20 and the number of anchors 14. While not shown, the third electrode 38 may be separated into a first conductive section and a second conductive section to form a second inter-digital transducer without departing from the principles of the present disclosure. The third electrode 38 may provide additional functionality of the MEMS vibrating device 10 by providing an additional electrical connection thereto.

As discussed above, a first AC signal is applied to the first electrode 28, while a second AC signal that is 180° out of phase with the first AC signal is applied to the second electrode 30. Because the first AC signal is 180° out of phase with the second AC signal, the area of the first piezoelectric thin-film layer 22 and the second piezoelectric thin-film layer 24 surrounding the first electrode 28 will mechanically deform in a first manner, while the area of the first piezoelectric thin-film layer 22 and the second piezoelectric thin-film layer 24 surrounding the second electrode 30 will mechanically deform in a second and opposite manner. For example, if the area of the first piezoelectric thin-film layer 22 and the second piezoelectric thin-film layer 24 surrounding the first electrode 28 expands, the area of the first piezoelectric thin-film layer 22 and the second piezoelectric thin-film layer 24 surrounding the second electrode 30 will contract, and vice-versa. Those of ordinary skill in the art will readily appreciate that the particular mechanical deformation experienced by the first piezoelectric thin-film layer 22 and the second piezoelectric thin-film layer 24 will vary based on the particular signals applied to the inter-digital transducer 18, the material of the first piezoelectric thin-film layer 22 and the second piezoelectric thin-film layer 24, and the polarization of the first piezoelectric thin-film layer 22 and the second piezoelectric thin-film layer 24. The mechanical deformation experienced due to the signals applied to the inter-digital transducer 18 may be used to modulate the electrical characteristics of the third electrode 38 such that an impedance of the third electrode 38 is modulated based on the signals applied to the inter-digital transducer 26. Alternatively, a signal applied to the third electrode 38 may be used to induce mechanical deformations in the first piezoelectric thin-film layer 22, the second piezoelectric thin-film layer 24, or both in order to modulate one or more electrical characteristics of the first electrode 28 and the second electrode 30.

Figure 9:
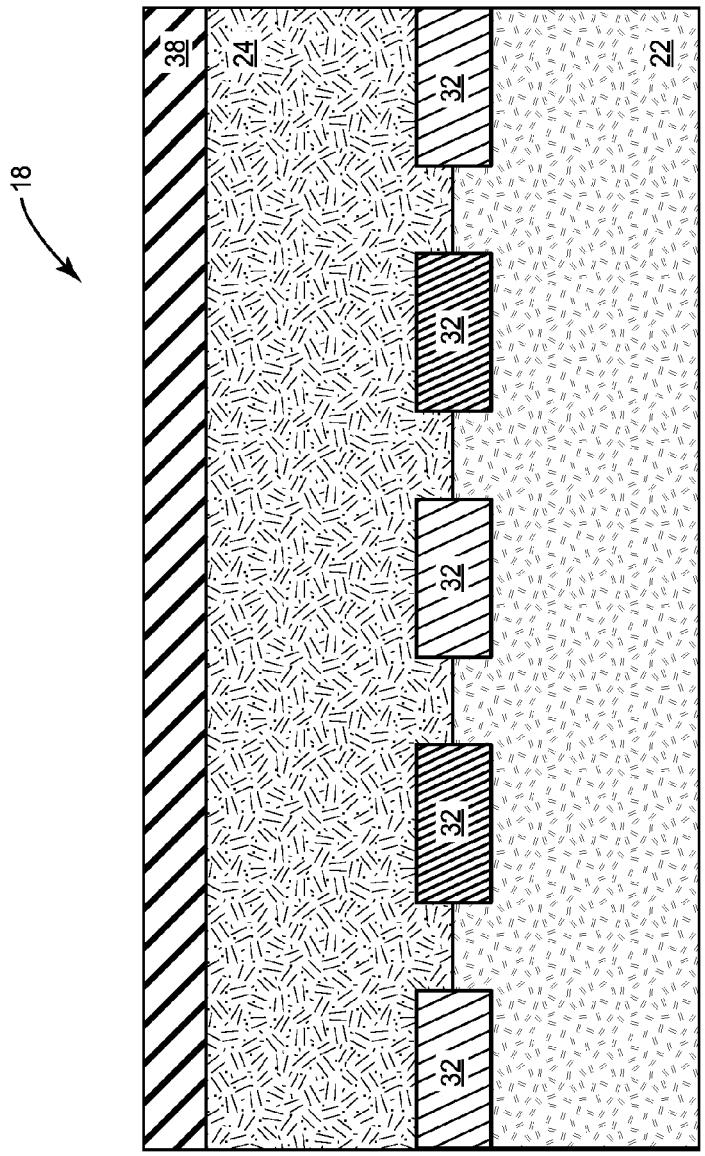
FIG. 9 is a cross-sectional view of a vibrating body in the MEMS device shown in FIG. 8 according to one embodiment of the present disclosure.

FIG. 9 shows a cross-sectional view of the vibrating body 18 of the MEMS vibrating device 10 shown in FIG. 8. Specifically, FIG. 9 shows a cross-section of the vibrating body 18 taken perpendicular to the front surface 34 thereof. The vibrating body 18 shown in FIG. 9 is substantially similar to that shown with respect to FIG. 3 above, except that the vibrating body 18 includes the third electrode 38. The third electrode 38 may be associated with a thickness $T_{TE}$, which may be between about 0.001 and 0.5 wavelengths. The third electrode 38 may comprise any suitable conductive material such as copper, tin, or the like.

Figure 10:
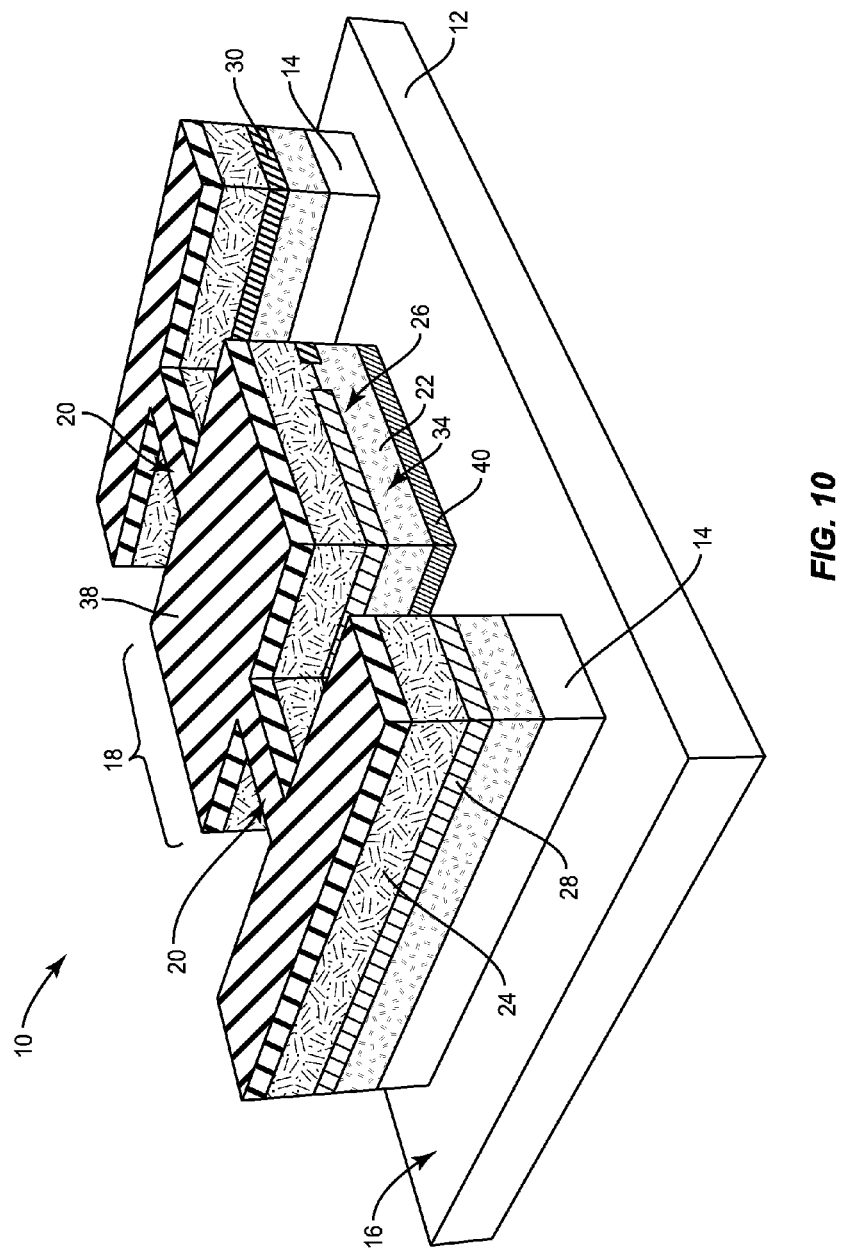
FIG. 10 is a three-dimensional representation of a MEMS device according to one embodiment of the present disclosure.

FIG. 10 shows the MEMS vibrating device 10 according to an additional embodiment of the present disclosure. The MEMS vibrating device 10 shown in FIG. 10 is substantially similar to that discussed above with respect to FIG. 8, but further includes a fourth electrode 40 over a surface of the first piezoelectric thin-film layer 22 facing the substrate 12. The fourth electrode 40 may be a solid electrode. While not shown, the fourth electrode 40 may form part of the one or more mechanical support members 20 and extend over the number of anchors 14 to support the vibrating body 18. Further, the fourth electrode 40 may be separated into a first conductive section and a second conductive section to form a second or third inter-digital transducer 26 without departing from the principles of the present disclosure. The fourth electrode 40 may provide additional functionality of the MEMS device by providing additional functionality thereto.

As discussed above, a first AC signal is applied to the first electrode 28, while a second AC signal that is 180° out of phase with the first AC signal is applied to the second electrode 30. Because the first AC signal is 180° out of phase with the second AC signal, the area of the first piezoelectric thin-film layer 22 and the second piezoelectric thin-film layer 24 surrounding the first electrode 28 will mechanically deform in a first manner, while the area of the first piezoelectric thin-film layer 22 and the second piezoelectric thin-film layer 24 surrounding the second electrode 30 will mechanically deform in a second and opposite manner. For example, if the area of the first piezoelectric thin-film layer 22 and the second piezoelectric thin-film layer 24 surrounding the first electrode 28 expands, the area of the first piezoelectric thin-film layer 22 and the second piezoelectric thin-film layer 24 surrounding the second electrode 30 will contract, and vice-versa. Those of ordinary skill in the art will readily appreciate that the particular mechanical deformation experienced by the first piezoelectric thin-film layer 22 and the second piezoelectric thin-film layer 24 will vary based on the particular signals applied to the inter-digital transducer 26, the material of the first piezoelectric thin-film layer 22 and the second piezoelectric thin-film layer 24, and the polarization of the first piezoelectric thin-film layer 22 and the second piezoelectric thin-film layer 24. The mechanical deformation experienced due to the signals applied to the inter-digital transducer 26 may be used to modulate the electrical characteristics of the third electrode 38 and/or the fourth electrode 40 such that an impedance of the third electrode 38 and/or the fourth electrode 40 is modulated based on the signals applied to the inter-digital transducer 26. Alternatively, a signal applied to the third electrode 38, the fourth electrode 40, or both may be used to induce mechanical deformations in the first piezoelectric thin-film layer 22, the second piezoelectric thin-film layer 24, or both in order to modulate one or more electrical characteristics of the first electrode 28 and the second electrode 30.

Figure 11:
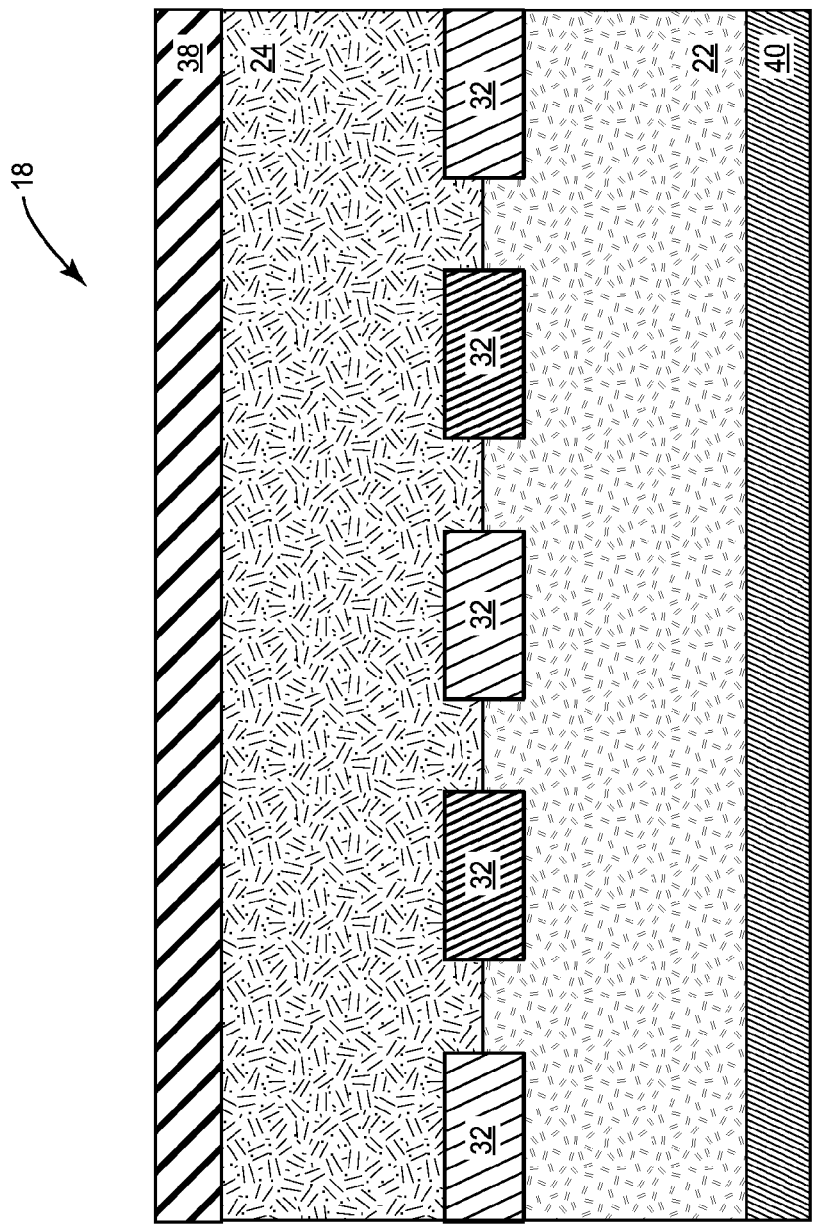
FIG. 11 is a cross-sectional view of a vibrating body in the MEMS device shown in FIG. 10 according to one embodiment of the present disclosure.

FIG. 11 shows a cross-sectional view of the vibrating body 18 according to one embodiment of the present disclosure. Specifically, FIG. 11 shows a cross-section of the vibrating body 18 taken perpendicular to the front surface 34 thereof. The vibrating body 18 shown in FIG. 11 is substantially similar to that discussed above with respect to FIG. 9, except that the vibrating body 18 further includes the fourth electrode 40. The fourth electrode 40 may be associated with a thickness $T_{FE}$, which may be between about 0.001 and 0.5 wavelengths. The fourth electrode 40 may comprise any suitable conductive material such as copper, tin, or the like.

Figure 12:
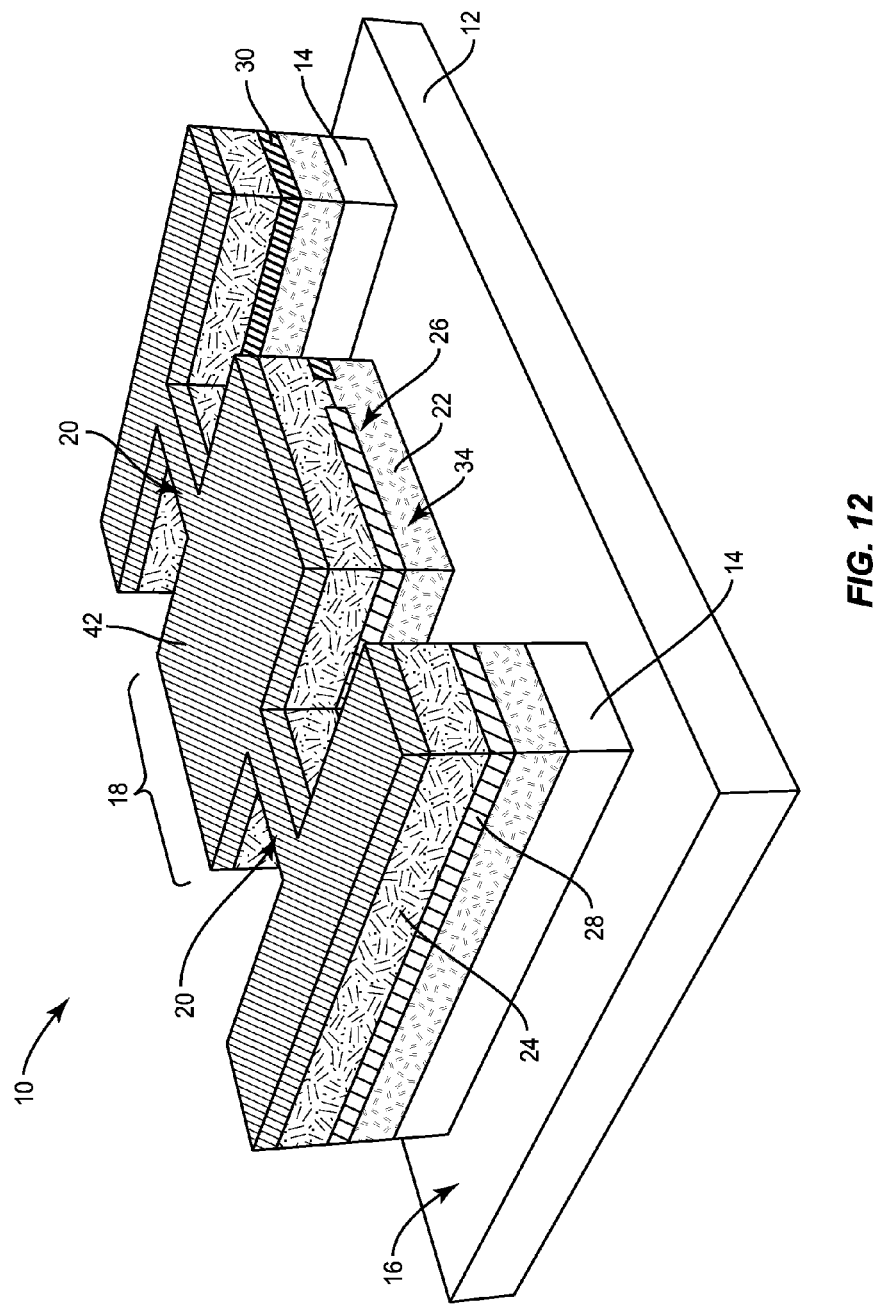
FIG. 12 is a three-dimensional view of a MEMS device according to one embodiment of the present disclosure.

In additional embodiments of the present disclosure, one or more functional layers may be added to an exposed surface of the first piezoelectric thin-film layer 22, the second piezoelectric thin-film layer 24, the third electrode 38, the fourth electrode 40, or any combination of the above in order to enhance the functionality of the MEMS vibrating device 10. Accordingly, FIG. 12 shows the MEMS vibrating device 10 including an exemplary functional layer 42 according to one embodiment of the present disclosure. The MEMS vibrating device 10 shown in FIG. 12 is substantially similar to that shown in FIG. 1, except that the MEMS vibrating device 10 further includes the functional layer 42 on a surface of the second piezoelectric thin-film layer 24 opposite the first piezoelectric thin-film layer 22. The functional layer 42 may be one of a dielectric material, a semiconductor material, an optically transparent material, an optically active material, a ferroelectric material, a pyroelectric material, a magnetostrictive material, and a ferromagnetic material. Accordingly, the functional layer 42 may add additional functionality to the MEMS vibrating device 10. Functional layers and their incorporation into a MEMS device are discussed in detail in copending U.S. patent application Ser. No. 14/679,379 assigned to RF Micro Devices of Greensboro, N.C., the contents of which are herein incorporated by reference in their entirety.

Those skilled in the art will recognize improvements and modifications to the embodiments of the present disclosure. All such improvements and modifications are considered within the scope of the concepts disclosed herein and the claims that follow.

What is claimed is:

1. A micro-electrical-mechanical system (MEMS) device comprising:
    a substrate;
    at least one anchor on a surface of the substrate; and
    a vibrating body suspended over the substrate by the at least one anchor and comprising:
        a first piezoelectric thin-film layer;
        a second piezoelectric thin-film layer over the first piezoelectric thin-film layer; and
        an inter-digital transducer embedded between the first piezoelectric thin-film layer and the second piezoelectric thin-film layer and comprising a first electrode and a second electrode each having a number of interlocking conductive sections;
    wherein a polarization of the first piezoelectric thin-film layer is parallel to a polarization of the second piezoelectric thin-film layer.

2. The MEMS device of claim 1 wherein the polarization of the first piezoelectric thin-film layer and the polarization of the second piezoelectric thin-film layer are parallel to the surface of the substrate.

3. The MEMS device of claim 1 wherein the polarization of the first piezoelectric thin-film layer and the polarization of the second piezoelectric thin-film layer are perpendicular to the surface of the substrate.

4. The MEMS device of claim 1 wherein the polarization of the first piezoelectric thin-film layer and the polarization of the second piezoelectric thin-film layer are oblique to the surface of the substrate.

5. The MEMS device of claim 1 further comprising a functional layer over a surface of the first piezoelectric thin-film layer facing the substrate.

6. The MEMS device of claim 5 further comprising an additional functional layer over a surface of the second piezoelectric thin-film layer opposite the first piezoelectric thin-film layer.

7. The MEMS device of claim 1 further comprising a functional layer over a surface of the second piezoelectric thin-film layer opposite the first piezoelectric thin-film layer.

8. A micro-electrical-mechanical system (MEMS) device comprising:
- a substrate;
- at least one anchor on a surface of the substrate; and
- a vibrating body suspended over the substrate by the at least one anchor and comprising:
  - a first piezoelectric thin-film layer;
  - a second piezoelectric thin-film layer over the first piezoelectric thin-film layer; and
  - an inter-digital transducer embedded between the first piezoelectric thin-film layer and the second piezoelectric thin-film layer and comprising a first electrode and a second electrode each having a number of interlocking conductive sections;
  - wherein a polarization of the first piezoelectric thin-film layer is opposite to a polarization of the second piezoelectric thin-film layer.

9. The MEMS device of claim 8 wherein the polarization of the first piezoelectric thin-film layer and the polarization of the second piezoelectric thin-film layer are parallel to the surface of the substrate.

10. The MEMS device of claim 8 wherein the polarization of the first piezoelectric thin-film layer and the polarization of the second piezoelectric thin-film layer are perpendicular to the surface of the substrate.

11. The MEMS device of claim 8 wherein the polarization of the first piezoelectric thin-film layer and the polarization of the second piezoelectric thin-film layer are oblique to the surface of the substrate.

12. The MEMS device of claim 8 further comprising a functional layer over a surface of the first piezoelectric thin-film layer facing the substrate.

13. The MEMS device of claim 12 further comprising an additional functional layer over a surface of the second piezoelectric thin-film layer opposite the first piezoelectric thin-film layer.

14. The MEMS device of claim 8 further comprising a functional layer over a surface of the second piezoelectric thin-film layer opposite the first piezoelectric thin-film layer.

15. A micro-electrical-mechanical system (MEMS) device comprising:
- a substrate;
- at least one anchor on a surface of the substrate; and
- a vibrating body suspended over the substrate by the at least one anchor and comprising:
  - a first piezoelectric thin-film layer;
  - a second piezoelectric thin-film layer over the first piezoelectric thin-film layer; and
  - an inter-digital transducer embedded between the first piezoelectric thin-film layer and the second piezoelectric thin-film layer and comprising a first electrode and a second electrode each having a number of interlocking conductive sections;
  - wherein a polarization of the first piezoelectric thin-film layer is oblique with respect to a polarization of the second piezoelectric thin-film layer.

16. The MEMS device of claim 15 wherein the polarization of the first piezoelectric thin-film layer and the polarization of the second piezoelectric thin-film layer are oblique to the surface of the substrate.

17. The MEMS device of claim 15 further comprising a functional layer over a surface of the first piezoelectric thin-film layer facing the substrate.

18. The MEMS device of claim 17 further comprising an additional functional layer over a surface of the second piezoelectric thin-film layer opposite the first piezoelectric thin-film layer.

19. The MEMS device of claim 15 further comprising a functional layer over a surface of the second piezoelectric thin-film layer opposite the first piezoelectric thin-film layer.

20. A micro-electrical-mechanical system (MEMS) device comprising:
- a substrate;
- at least one anchor on a surface of the substrate; and
- a vibrating body suspended over the substrate by the at least one anchor and comprising:
  - a first piezoelectric thin-film layer;
  - a second piezoelectric thin-film layer over the first piezoelectric thin-film layer;
  - an inter-digital transducer embedded between the first piezoelectric thin-film layer and the second piezoelectric thin-film layer and comprising a first electrode and a second electrode each having a number of interlocking conductive sections;
  - a third electrode over a surface of the first piezoelectric thin-film layer facing the substrate; and
  - a fourth electrode over a surface of the second piezoelectric thin-film layer opposite the first piezoelectric thin-film layer.

21. The MEMS device of claim 20 wherein a polarization of the first piezoelectric thin-film layer is parallel to a polarization of the second piezoelectric thin-film layer.

22. The MEMS device of claim 21 wherein the polarization of the first piezoelectric thin-film layer and the polarization of the second piezoelectric thin-film layer are parallel to the surface of the substrate.

23. The MEMS device of claim 21 wherein the polarization of the first piezoelectric thin-film layer and the polarization of the second piezoelectric thin-film layer are perpendicular to the surface of the substrate.

24. The MEMS device of claim 21 wherein the polarization of the first piezoelectric thin-film layer and the polarization of the second piezoelectric thin-film layer are oblique to the surface of the substrate.

25. The MEMS device of claim 20 wherein a polarization of the first piezoelectric thin-film layer is opposite to a polarization of the second piezoelectric thin-film layer.

26. The MEMS device of claim 25 wherein the polarization of the first piezoelectric thin-film layer and the polarization of the second piezoelectric thin-film layer are parallel to the surface of the substrate.

27. The MEMS device of claim 25 wherein the polarization of the first piezoelectric thin-film layer and the polarization of the second piezoelectric thin-film layer are perpendicular to the surface of the substrate.

28. The MEMS device of claim 25 wherein the polarization of the first piezoelectric thin-film layer and the polarization of the second piezoelectric thin-film layer are oblique to the surface of the substrate.

29. The MEMS device of claim 20 wherein a polarization of the first piezoelectric thin-film layer is oblique with respect to a polarization of the second piezoelectric thin-film layer.

30. The MEMS device of claim 29 wherein the polarization of the first piezoelectric thin-film layer and the polarization of the second piezoelectric thin-film layer are oblique to the surface of the substrate.

31. The MEMS device of claim 20 further comprising a functional layer over a surface of the first conductive layer opposite the first piezoelectric thin-film layer.

32. The MEMS device of claim 31 further comprising an additional functional layer over a surface of the second conductive layer opposite the second piezoelectric thin-film layer.

33. The MEMS device of claim 20 further comprising a functional layer over a surface of the second conductive layer opposite the second piezoelectric thin-film layer.

34. A micro-electrical-mechanical system (MEMS) device comprising:
- a substrate;
- at least one anchor on a surface of the substrate; and
- a vibrating body suspended over the substrate by the at least one anchor and comprising:
  - a first piezoelectric thin-film layer;
  - a second piezoelectric thin-film layer over the first piezoelectric thin-film layer;
  - an interposer layer between the first piezoelectric thin-film layer and the second piezoelectric thin-film layer; and
  - an inter-digital transducer embedded in the interposer layer and comprising a first electrode and a second electrode each having a number of interlocking conductive sections.

* * * * *

UNITED STATES PATENT AND TRADEMARK OFFICE
CERTIFICATE OF CORRECTION

| | | |
|---|---|---|
| PATENT NO. | : 9,998,088 B2 | Page 1 of 1 |
| APPLICATION NO. | : 14/703060 | |
| DATED | : June 12, 2018 | |
| INVENTOR(S) | : Kushal Bhattacharjee and Sergei Zhgoon | |

It is certified that error appears in the above-identified patent and that said Letters Patent is hereby corrected as shown below:

In the Specification

In Column 6, Lines 58 and 59, replace "TFP" with --$T_{FP}$--.

In Column 6, Lines 58 and 61, replace "WFP" with --$W_{FP}$--.

In Column 6, Lines 64 and 65, replace "TSP" with --$T_{SP}$--.

In Column 6, Lines 64 and 66, replace "WSP" with --$W_{SP}$--.

In Column 7, Lines 1 and 4, replace "TFP" with --$T_{FP}$--.

In Column 7, Line 2, replace "TSP" with --$T_{SP}$--.

In Column 7, Line 5, replace "TSC" with --$T_{SC}$--.

Signed and Sealed this
Seventeenth Day of July, 2018

Andrei Iancu
*Director of the United States Patent and Trademark Office*